(12) United States Patent
Miller et al.

(10) Patent No.: US 11,923,151 B2
(45) Date of Patent: Mar. 5, 2024

(54) STRUCTURAL LEAD FRAME

(71) Applicant: KEMET Electronics Corporation, Simpsonville, SC (US)

(72) Inventors: Galen W. Miller, Simpsonville, SC (US); John Bultitude, Simpsonville, SC (US); Lonnie G. Jones, Simpsonville, SC (US)

(73) Assignee: KEMET Electronics Corporation

( * ) Notice: Subject to any disclaimer, the term of this patent is extended or adjusted under 35 U.S.C. 154(b) by 299 days.

(21) Appl. No.: 17/148,038

(22) Filed: Jan. 13, 2021

(65) Prior Publication Data

US 2021/0241977 A1  Aug. 5, 2021

Related U.S. Application Data

(60) Provisional application No. 62/969,408, filed on Feb. 3, 2020.

(51) Int. Cl.

| | | |
|---|---|---|
| *H01G 4/38* | (2006.01) | |
| *H01G 2/04* | (2006.01) | |
| *H01G 2/08* | (2006.01) | |
| *H01G 2/10* | (2006.01) | |
| *H01G 4/30* | (2006.01) | |
| *H01G 13/00* | (2013.01) | |
| *H05K 1/02* | (2006.01) | |
| *H05K 1/14* | (2006.01) | |
| *H05K 1/18* | (2006.01) | |
| *H05K 3/32* | (2006.01) | |
| *H01L 25/07* | (2006.01) | |

(Continued)

(52) U.S. Cl.
CPC ............. *H01G 4/38* (2013.01); *H01G 2/04* (2013.01); *H01G 2/08* (2013.01); *H01G 2/10* (2013.01); *H01G 4/30* (2013.01); *H01G 13/00* (2013.01); *H05K 1/0272* (2013.01); *H05K 1/145* (2013.01); *H05K 1/18* (2013.01); *H05K 1/181* (2013.01); *H05K 3/328* (2013.01); *H01L 25/072* (2013.01); *H01L 29/1608* (2013.01); *H01L 29/2003* (2013.01); *H05K 2201/10015* (2013.01); *H05K 2201/10166* (2013.01); *H05K 2201/10424* (2013.01); *H05K 2201/10545* (2013.01)

(58) Field of Classification Search
CPC ........................................ H01G 4/38
USPC ........................................ 174/260
See application file for complete search history.

(56) References Cited

U.S. PATENT DOCUMENTS

| | | |
|---|---|---|
| 8,331,078 B2 | 12/2012 | McConnell et al. |
| 8,720,050 B2 | 5/2014 | Chikagawa et al. |

(Continued)

OTHER PUBLICATIONS

ISA/US; International Search Report and Written Opinion prepared for PCT/US2021/013238; dated May 25, 2021.

*Primary Examiner* — Stanley Tso
(74) *Attorney, Agent, or Firm* — Joseph T. Guy; Patent Filing Specialist Inc.

(57) ABSTRACT

Provided is an improved electronic component package. The electronic component package comprises a multiplicity of electronic components wherein each electronic component comprises a first external termination and a second external termination. The electronic component package also includes a structural lead frame comprising multiple leads wherein each lead is mounted to at least one first external termination and the structural lead frame comprises at least one break away feature between adjacent leads.

45 Claims, 18 Drawing Sheets

(51) Int. Cl.
   *H01L 29/16* (2006.01)
   *H01L 29/20* (2006.01)

(56) References Cited

U.S. PATENT DOCUMENTS

| | | |
|---|---|---|
| 9,171,672 B2 | 10/2015 | McConnell et al. |
| 9,472,342 B2 | 10/2016 | McConnell et al. |
| 9,875,851 B2 | 1/2018 | Engel et al. |
| 9,905,363 B2 | 2/2018 | Engel et al. |
| 10,325,895 B2 | 6/2019 | Nakahara |
| 10,395,843 B2 | 8/2019 | Koini et al. |
| 2004/0259419 A1* | 12/2004 | Payne ............... H01R 13/6474 439/607.05 |
| 2007/0003195 A1* | 1/2007 | Ice ..................... G02B 6/4201 385/92 |
| 2010/0330708 A1* | 12/2010 | Engel .................... G01D 5/147 257/E21.502 |
| 2013/0016488 A1* | 1/2013 | McConnell ............ H01G 4/232 361/774 |
| 2015/0114697 A1* | 4/2015 | Murrell ............ H01L 23/49861 174/255 |
| 2016/0242313 A1* | 8/2016 | Singh .................... H05K 1/184 |
| 2017/0358397 A1 | 12/2017 | McConnell et al. |
| 2019/0200457 A1* | 6/2019 | Burk .................... H03H 7/0115 |
| 2019/0215950 A1 | 7/2019 | Bauer-Öppinger et al. |
| 2020/0075262 A1* | 3/2020 | Cho ..................... H01G 4/232 |

* cited by examiner

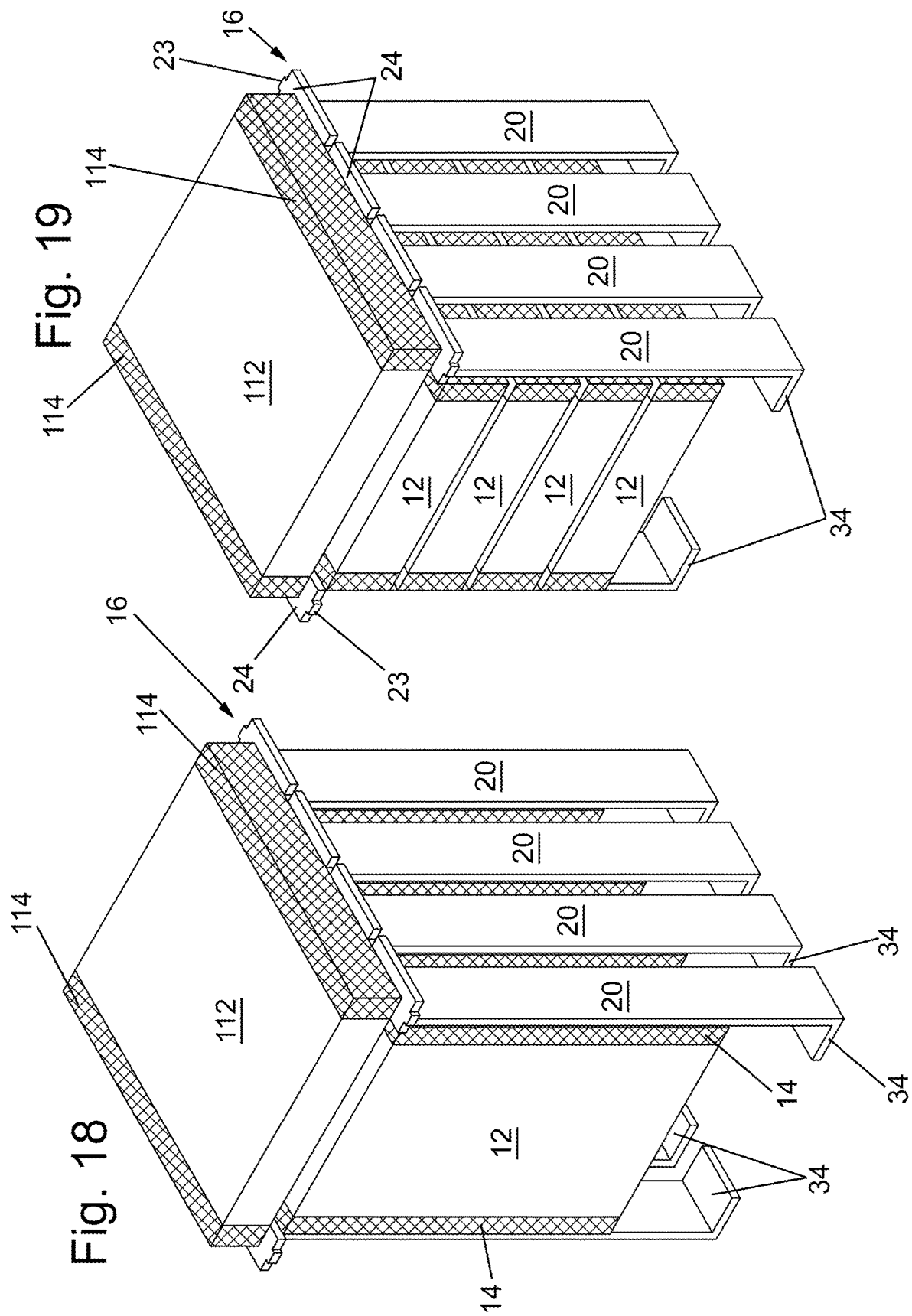

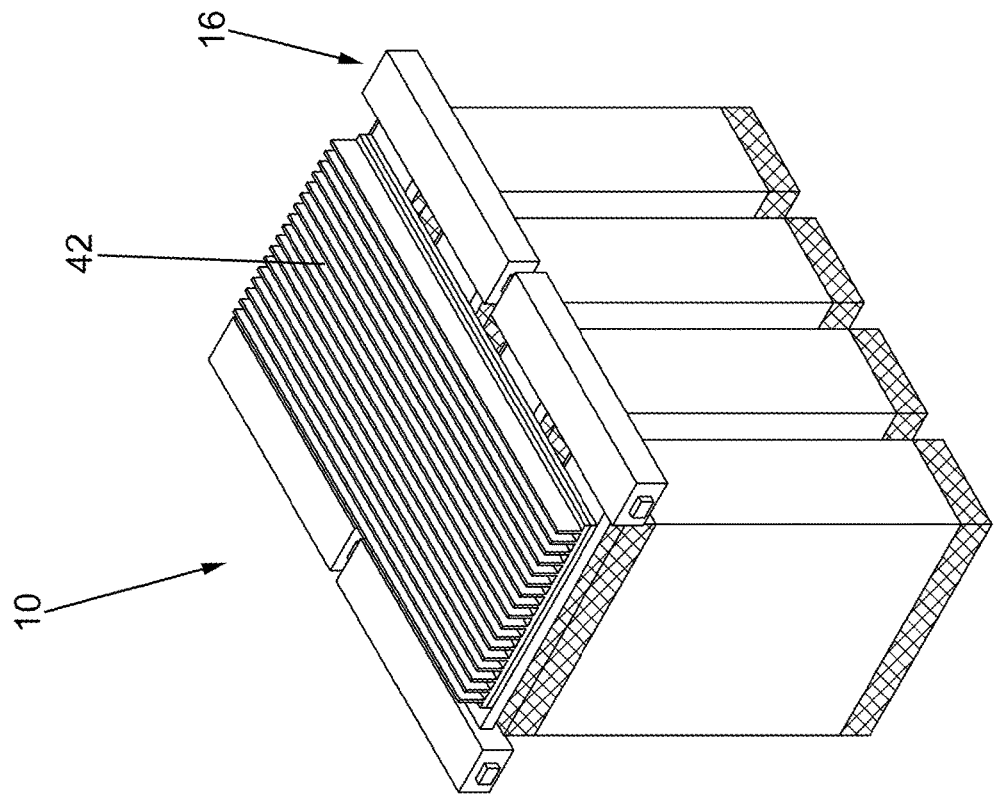
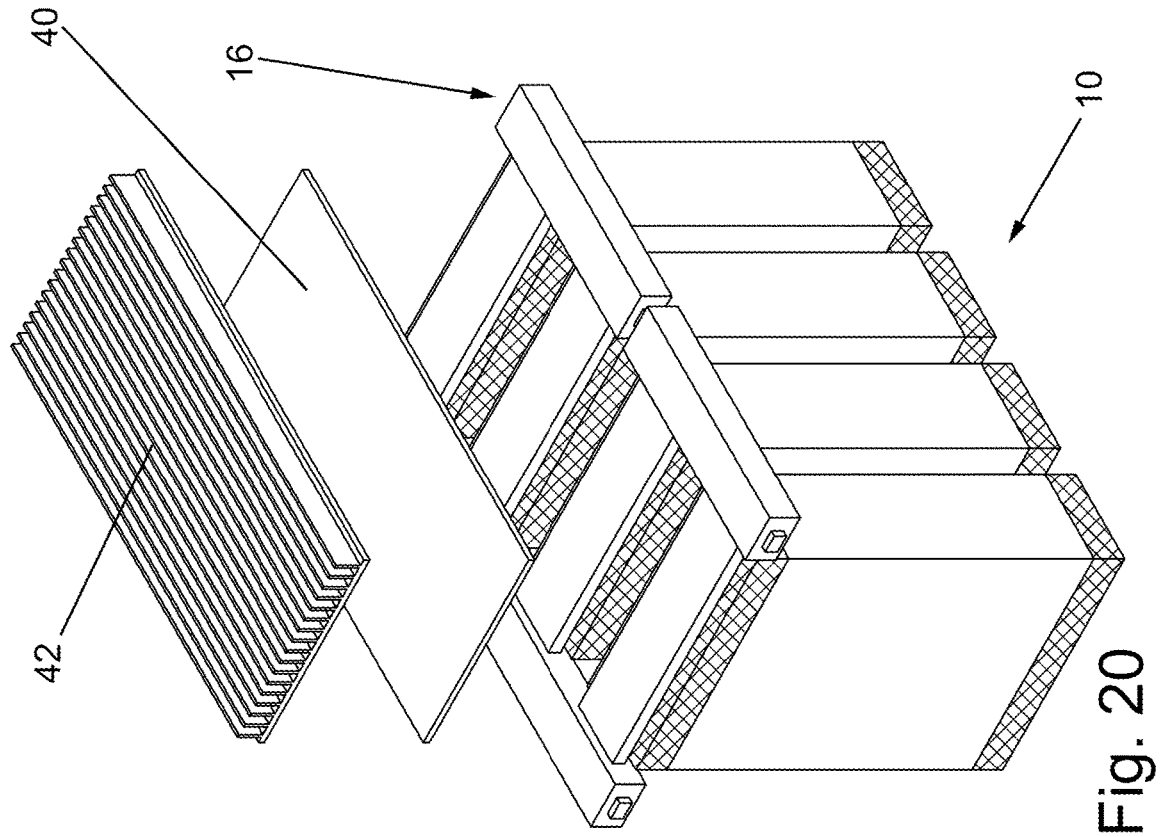

STRUCTURAL LEAD FRAME

CROSS-REFERENCE TO RELATED APPLICATIONS

This application claims the priority of U.S. Provisional Application No. 62/969,408 filed Feb. 3, 2020 which is incorporated herein by reference.

FIELD OF THE INVENTION

The invention is related to an electrical component package formed from a structural lead frame. The electrical component package is particularly suitable for use in an electrical circuit assembly comprising multiple, preferably passive, electronic components. The invention is particularly suitable for use in forming an array of multilayered ceramic capacitors (MLCC's).

BACKGROUND

The present invention is specific to structural lead frames which are particularly suitable for the formation of an electronic component package comprising an array of preferably passive electronic components, particularly MLCC's, wherein the electronic component package is particularly suitable for incorporation into an electrical circuit assembly.

There has been an ongoing demand for increased electrical functionality within ever decreasing circuit volume. Efforts to satisfy this demand, generally referred to as miniaturization, has increased the demand for electrical product designs provides for improved electrical performance in smaller electronic packages thereby reducing the space occupied on a circuit board without impacting product performance. Further complicating this effort is the parallel demand for lower cost electronics which places an additional burden on manufacturing systems and methods.

Part of the general desire for miniaturization is a demand for higher voltage devices within the same volume or, even more preferably, in a smaller volume. Unfortunately, higher voltages result in an increase in heat generation. This places an increased burden on the designer to include structural elements capable of removing heat from the individual components specifically and the assembly of components in general. The increasing demand for higher voltage products is a particular concern when using MLCC's, or an MLCC module, since an increase in the temperature of an MLCC results in a decrease in electrical performance.

Provided herein is a method for mitigating these issues with a package design that allows reduced assembly costs by integrating multiple components into a single package. The package saves assembly time, cost and printed circuit board space while simultaneously enhancing the product performance. Additional cost savings can be realized in a package design requiring a single lead frame versus the common two lead frame package designs.

SUMMARY OF THE INVENTION

The present invention is related to an improved structural lead frame suitable for forming electrical component packages of electronic components.

A particular feature of the present invention is the ability to form large arrays of electronic components in an electrical component package wherein subsets of the large arrays can be separated to optimize the number of electronic components in an array.

Another particular feature of the invention is the ability to incorporate auxiliary electronic components to the electrical component package wherein electronic components and auxiliary electronic components can be in electrical parallel, electrical series or combinations of both.

These and other advantages, as will be realized, are provided in an electronic component package. The electronic component package comprises a multiplicity of electronic components wherein each electronic component comprises a first external termination and a second external termination. The electronic component package also includes a structural lead frame comprising multiple leads wherein each lead is mounted to at least one first external termination and the structural lead frame comprises at least one break away feature between adjacent leads.

Yet another embodiment is provided in an electrical circuit assembly comprising an electronic component package. The electronic component package comprises a multiplicity of electronic components wherein each electronic component comprises a first external termination and a second external termination. The electronic component package further comprises a structural lead frame comprising multiple leads wherein each lead is mounted to at least one first external termination. The structural lead frame comprises at least one break away feature between adjacent leads. A circuit board is provided wherein the circuit board comprises a first trace and a second trace and at least one lead is in electrical contact with the first trace.

Yet another advantage is provided in a method of forming an electrical circuit assembly. The method comprises:
  forming an electronic component package comprising:
    arranging a multiplicity of electronic components into an array wherein each electronic component comprises a first external termination and a second external termination;
    attaching a structural lead frame to the array of electronic components to form an electrical component package wherein the structural lead frame comprises multiple leads wherein each lead is mounted to at least one first external termination and wherein the structural lead frame comprises at least one break away feature between adjacent leads; and
  attaching the electrical component package to a circuit board wherein the circuit board comprises a first trace and a second trace and at least one said lead is in electrical contact with the first trace.

BRIEF DESCRIPTION OF DRAWINGS

FIG. 18 is a schematic perspective view of an embodiment of the invention.

FIG. 19 is a schematic perspective view of an embodiment of the invention.

FIG. 20 is a schematic partially exploded view of an embodiment of the invention.

FIG. 21 is a schematic perspective view of an embodiment of the invention.

DESCRIPTION

Figure 1:
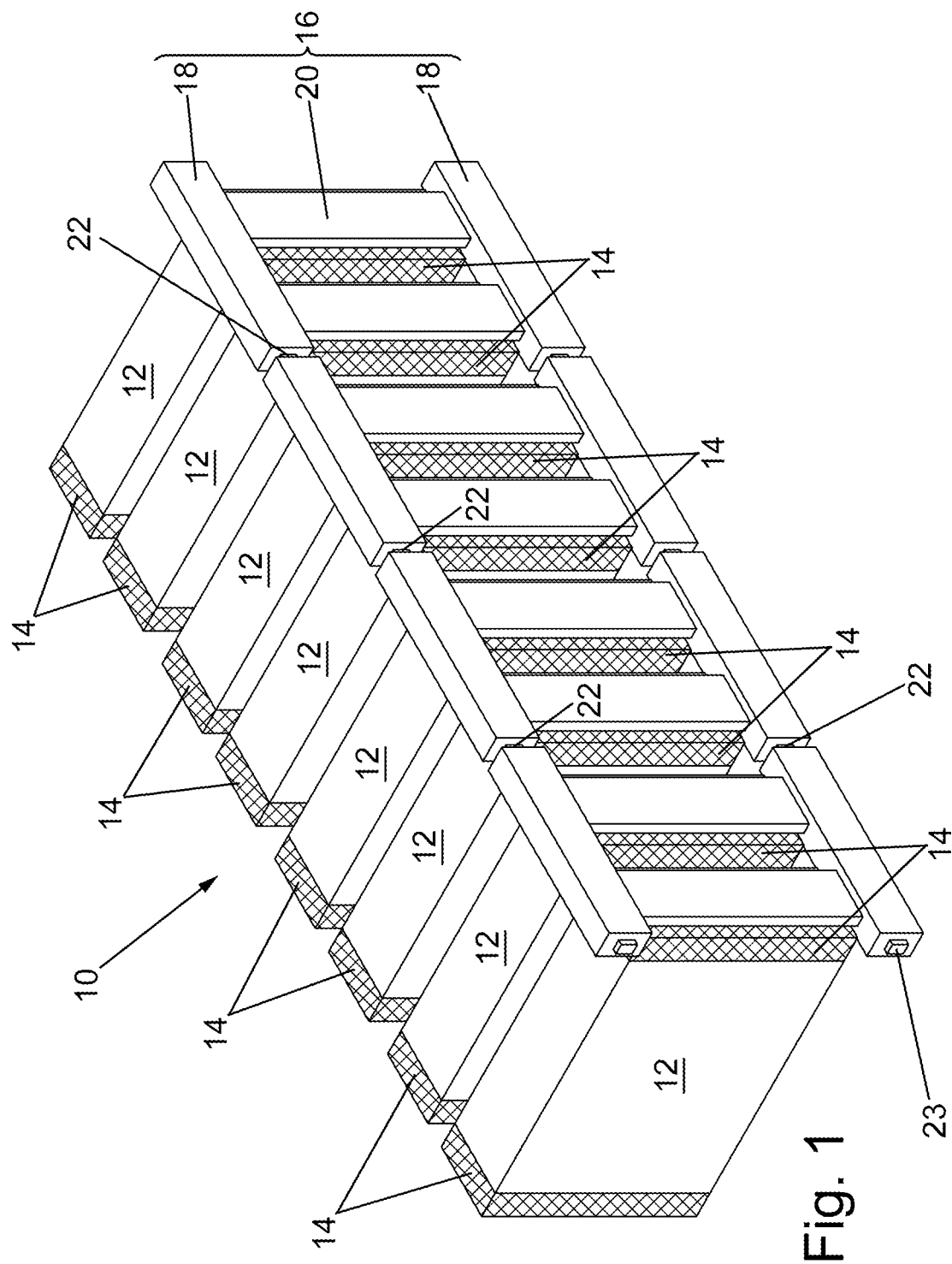
FIG. 1 is a schematic perspective view of an embodiment of the invention.

This present invention is directed to an electrical component package for use in an electrical circuit assembly wherein the electronic component package comprises multiple, preferably passive, electronic components. A particularly preferred passive electronic component is a multilayered ceramic capacitor (MLCC). The invention provides for the formation of an array of electronic components wherein external terminations of the electronic component are connected, electrically and/or mechanically, to adjacent external terminations in the array. This provides a structural lead frame which is particularly suitable for the formation of a Surface Mount Technology (SMT) component package.

The structural lead frame allows the electronic components in the electrical component package to be electrically connected in series, in parallel, or a combination of both when mounted to a printed circuit board (PCB). In an embodiment, the structural lead frame allows the number of electronic components in the electrical component package to be selected by the means of a breakaway feature on the structural lead frame of the component package thereby allowing the capacitance value of the electrical component package to be configurable.

In an embodiment, the orientation of the electronic component, particularly MLCC's, within the electrical component package can be varied to enhance the performance of the electrical component package in the application of use. Although MLCC devices are discussed herein as a preferred electronic component for convenience, other electronic components or combinations of electronic components may be applied in place of the MLCC and any description referencing MLCC herein is inclusive of other electronic components with passive electronic components being preferred.

This structural lead frame increases electrical performance and miniaturization within an electronic component package thereby allowing multiple electronic components to be packaged as one with a single structural lead frame or dual structural lead frames. This reduces the board space requirement and permits the electronic components to be oriented to improve the electrical performance of the electronic component package and therefore the electrical circuit assembly.

A single structural lead frame design reduces material costs by eliminating one of the typical two lead frames in current leaded packages. Although MLCC component packages with lead frames already exist, none have the option to mount the MLCC package on a printed circuit board (PCB) on only one set of the MLCC end terminals or to feature a break-away in the lead frame to allow the capacitance value (CV) to be selected from a larger CV package.

A particular advantage of the invention is the ability to provide a structural lead frame for forming an array of passive electronic components in electrical series. The structural lead frame incorporates a series of smaller leads attached to the array of passive components to reduce the effects of the coefficient of expansion (COE) of the dissimilar mating materials as well as minimizing the mechanical stress incurred in the electronic component package by minimizing the area of contact between the lead and the external termination of the electronic component.

The structural lead frame is preferably attached to an external termination of the electronic component via a transient liquid phase sintered (TLPS) material or other high melting point interconnect material that allows for the electronic component package to withstand subsequent reflow cycles when the electronic component package is assembled in the electrical circuit assembly.

The structural lead frame is preferably formed of an electrically conductive ferrous or non-ferrous material such as phosphor bronze or alloy 42 with a preference for minimizing the impact of the coefficient of thermal expansion of the dissimilar mating materials.

When used with MLCC's the structural lead frame facilitates the option of selecting a capacitance value (CV) with the inclusion of a breakaway feature that allows for selection of the number of capacitors and therefore a desired CV. Similar advantages can be realized with other electrical components or with combinations of electrical components, to be selected from a larger sized component package.

The structural lead frame allows the multiplicity of electronic components to be configured in electrical series, in electrical parallel, or in a combination of both within a common electrical component package. It is also known that the orientation of an electronic component can have an impact on the electrical performance in an electrical circuit assembly. By way of non-limiting example, the relative orientation of MLCC's to each other in an array can have an impact on equivalent series resistance (ESR) and equivalent series inductance (ESL).

In an embodiment the structural lead frame allows electronic component orientation within the electrical component package to be changed to improve the electrical performance of the electrical component package. An electronic component package comprising passive electronic components can be provided with the attachment of other passive electronic components particularly selected from an MLCC, a resistor, a varistor, a diode, a fuse, an inductor, an overvoltage discharge device, a sensor, a switch, an electrostatic discharge suppressor and an integrated circuit connected to the structural lead frame. The electrical component package permits the layout of the printed circuit board (PCB) to be significantly reduced in size over the required space for discrete electronic components oriented in electrical series and/or electrical parallel electrical layout while also providing isolation to mechanical stresses that might be incurred during buildup of the electrical circuit assembly or use of the electrical circuit assembly.

The invention will be described with reference to the figures forming an integral, but non-limiting, component of the disclosure. Throughout the various figures similar elements may be number accordingly.

An embodiment of the invention will be described with reference to FIG. 1 wherein an electrical component package, 10, is illustrated schematically in perspective view. In FIG. 1, a multiplicity of electronic components, 12, are illustrated in an array wherein the number of electronic components in the array is not limited herein. Each electronic component of the electronic components comprises external terminations, 14, wherein external terminations of an electronic component are of opposite electrical polarity. Each external termination is defined as having a single end face, wherein each end face of an electronic component are approximately parallel to each other, and side faces wherein the side faces are perpendicular to the end face and generally collectively circumnavigate the electronic component. External terminations of adjacent electronic components are attached to a structural lead frame, 16, wherein the structural lead frame comprises leads, 20, and optional but preferred over mold, 18, as will be further described herein. The external terminations of adjacent electronic components are independently mounted to adjacent leads by a conductive adhesive as will be further described herein. The number of electronic components attached to a single structural lead frame can be quite large to facilitate manufacturing, shipping and handling. The number of electronic components can be easily reduced by separation of a subset of the mounted electronic components from the large array at break-away features, 22, thereby allowing a select number of mounted electronic components to be used during assembly of an electronic circuit assembly. For the purposes of illustration, a break-away feature is illustrated after every group of two electronic components without limit thereto. As illustrated in FIG. 1, the structural lead frame may be on only one side of the array with the opposite side being mountable directly to a circuit trace, to a second structural lead frame or to some other attachment feature such as a ball array, a conventional lead frame, a flexible termination or related termination components or techniques without limit thereto. In the embodiment of FIG. 1 the electronic components can all be mounted in electrically series or combinations of electronic components can be in electrical parallel as will be further described herein. In FIG. 1 each external termination is connected to a dedicated lead and each lead is only mechanically attached to one external termination of a single electronic component.

Figure 2:
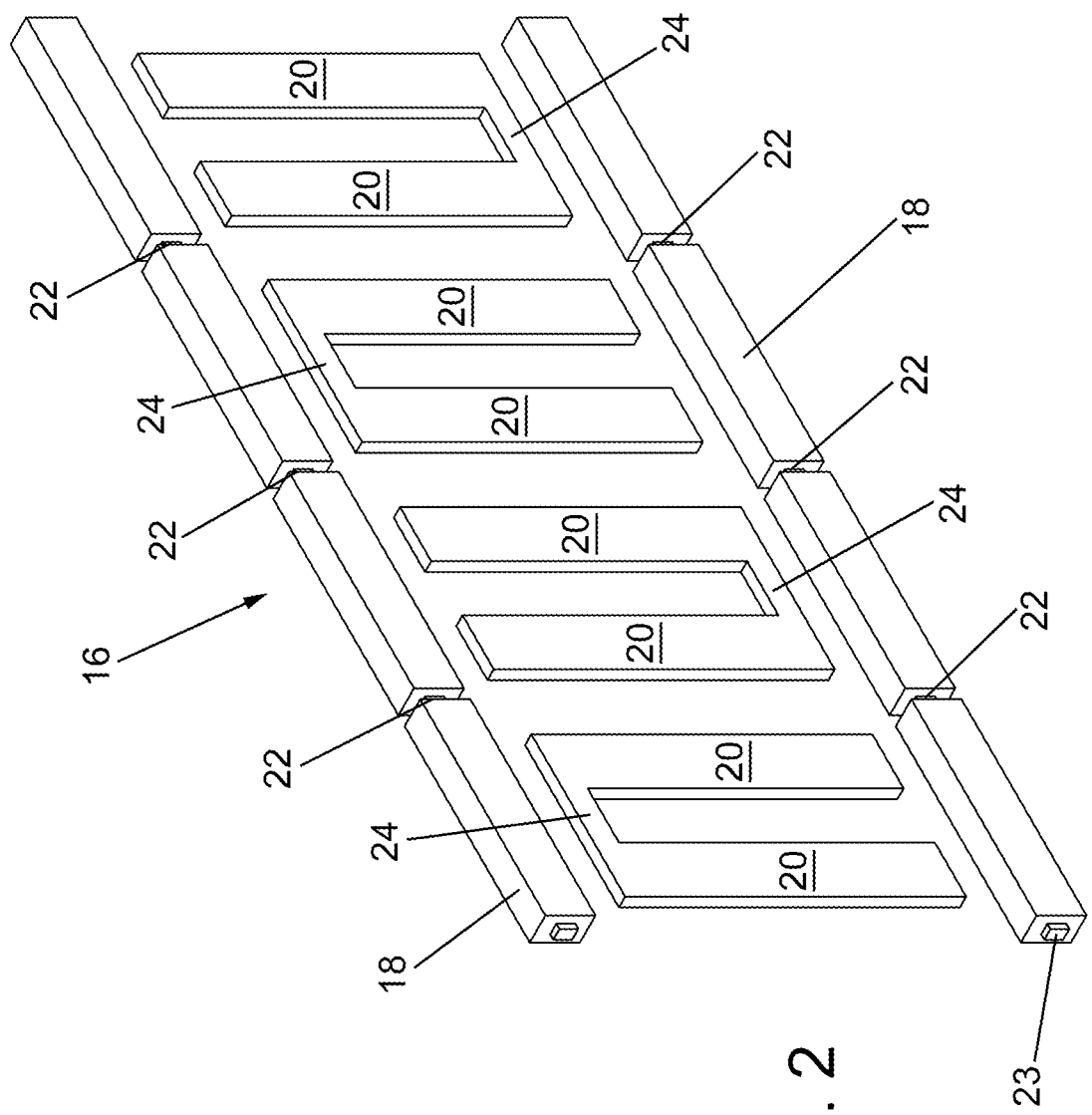
FIG. 2 is a schematic exploded view of an embodiment of the invention.
Figure 3:
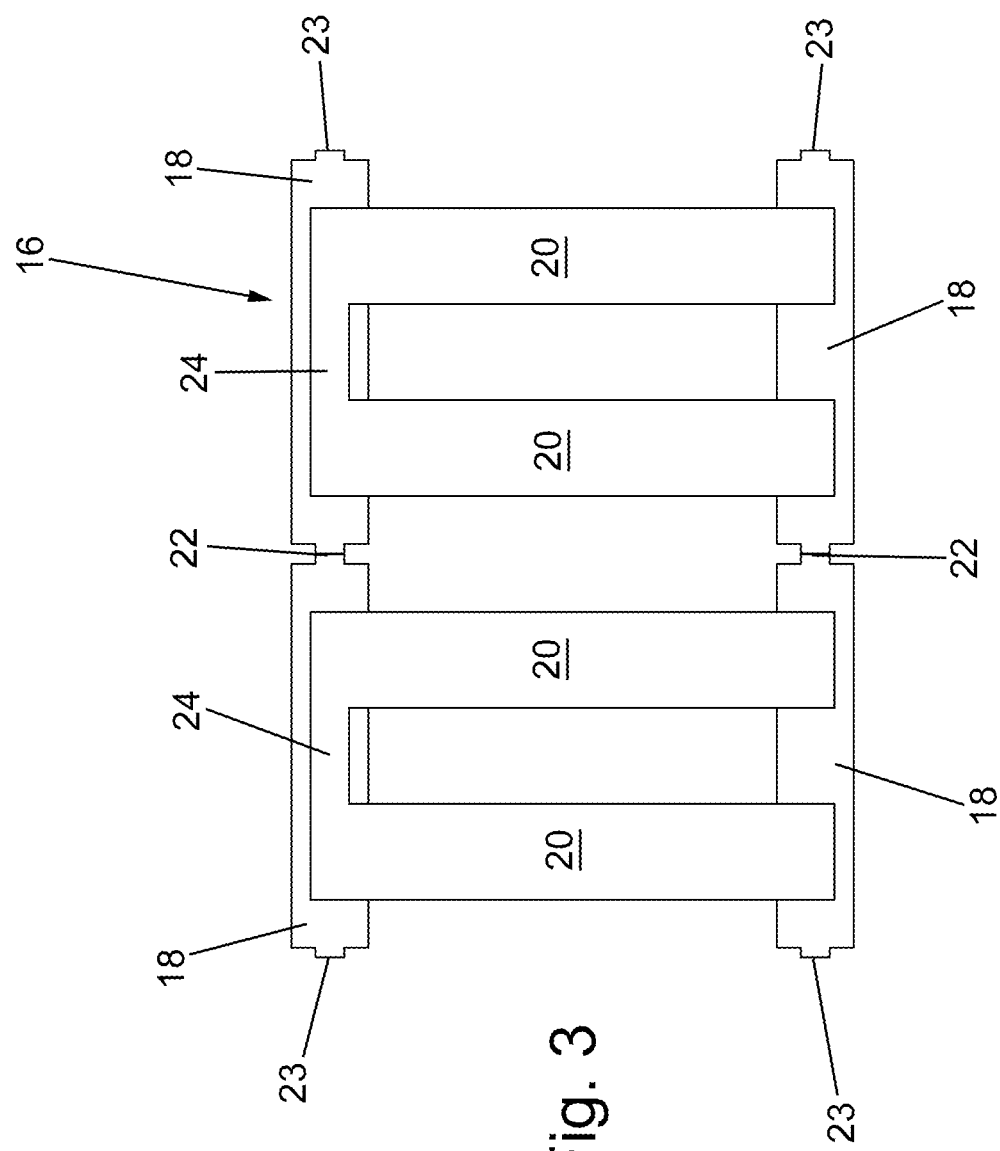
FIG. 3 is a schematic cross-sectional view of an embodiment of the invention.

An embodiment of the structural lead frame will be described with reference to FIGS. 2 and 3. FIG. 2 is an exploded perspective view wherein a structural lead frame is illustrated schematically. FIG. 3 is a schematic representation of a structural lead frame in cross-sectional view. In FIGS. 2 and 3 adjacent leads, 20, are electrically connected by lead connectors, 24, and the lead connectors, and optionally a small portion of the lead, are optionally and preferably encased in an over mold, 18. The break-away feature, 22, allows select numbers of electronic components to be separated from the array as discussed above wherein once separated a break-away artifact, 23, may be visible wherein the break-away artifact is a remaining portion of the break-away feature.

Figure 4:
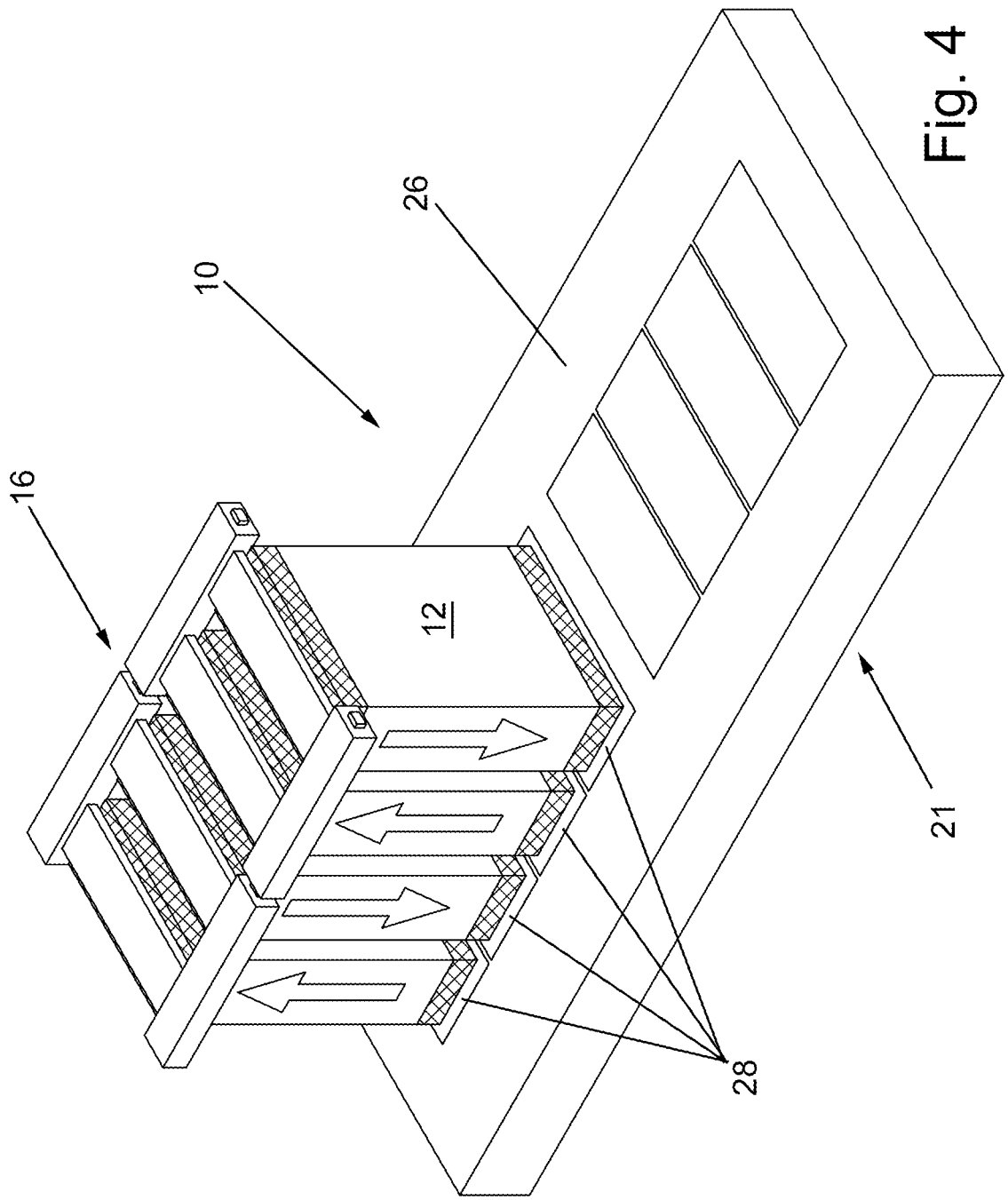
FIG. 4 is a schematic perspective view of an embodiment of the invention.

An embodiment of the invention will be described with reference to FIG. 4 wherein an array of electronic components, 12, mounted to a structural lead frame, 16, are illustrated schematically as an electronic component package, 10, mounted to a printed circuit board, 26, comprising traces, 28, wherein the printed circuit board is part of an electrical circuit assembly, 21. In the embodiment illustrated in FIG. 4, each pair of adjacent capacitors is in electrical series wherein current flow is in opposite directions, as indicated by the arrows, thereby reducing inductance. The orientation of the electronic components in FIG. 4 is defined as a vertical orientation wherein the largest face of the electronic component is approximately perpendicular to the printed circuit board.

Figure 5:
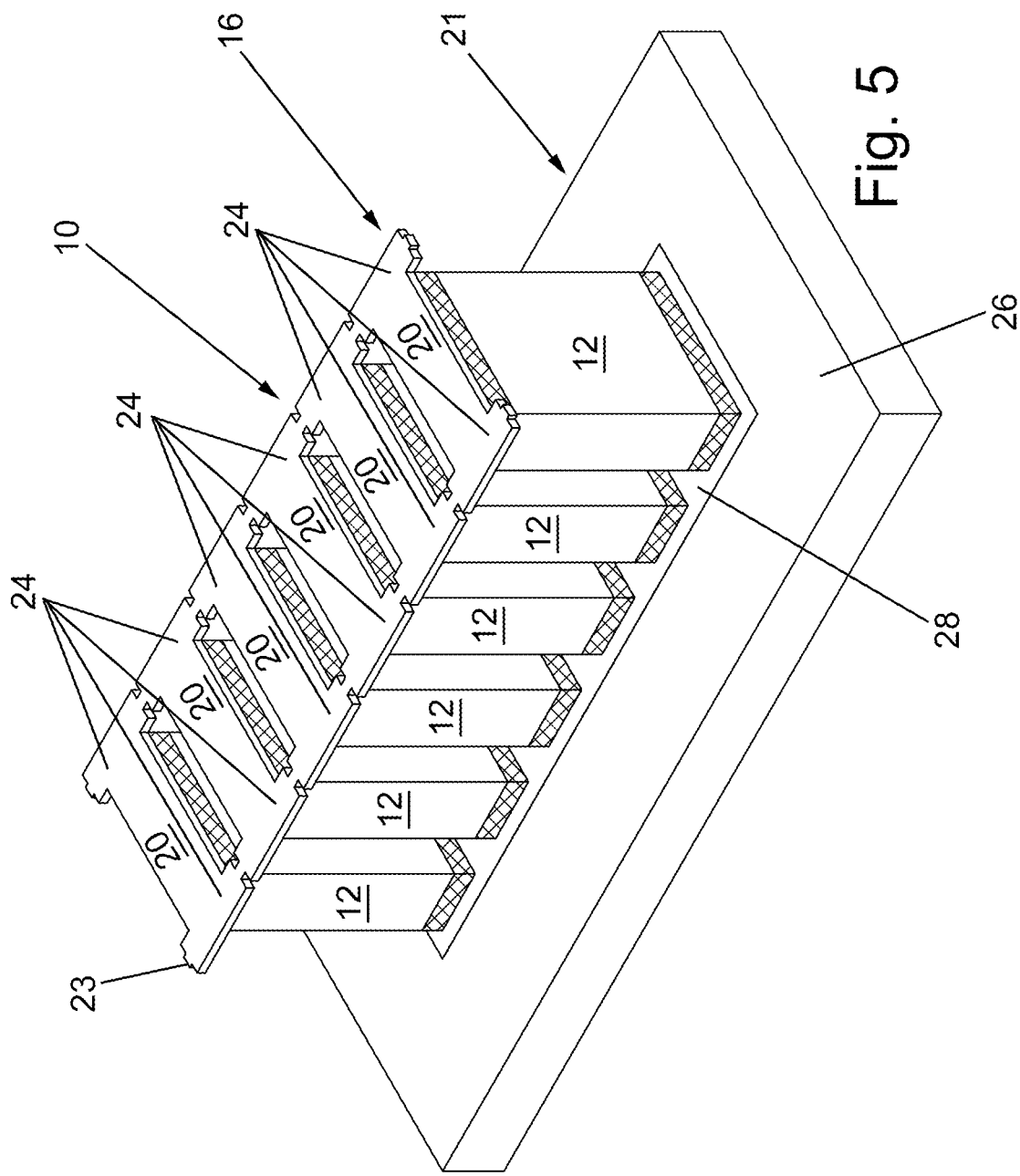
FIG. 5 is a schematic perspective view of an embodiment of the invention.

An embodiment of the invention will be described with reference to FIG. 5. In FIG. 5 an electrical component package, 10, is illustrated schematically in perspective view. In FIG. 5, the end of external terminations of each of a series of electronic components, 12, are mounted to and in electrical contact with a lead, 20, of a structural lead frame, 16, wherein the structural lead frame is shown without the optional over mold. Each lead, 20, is in electrical connection with at least one adjacent lead by a lead connector, 24, wherein the lead connector has a break-away feature, 22, integral thereto. The embodiment illustrated in FIG. 5 could be mounted between printed circuit boards wherein the structural lead frame, 16, would be in electrical contact with a circuit trace on an upper circuit board which is not shown. Alternatively, the structural lead frame could be in electrical contact with a circuit trace of printed circuit board, 26, by a wire, a jumper, a flexible termination or any electrical connection method known in the art. As would be realized, the number of electronic components in the electrical component package is not limited by the figure and any number of electronic components can be separated from the electrical component package to form a smaller electrical component package by separation at the appropriate break-away feature.

Figure 6:
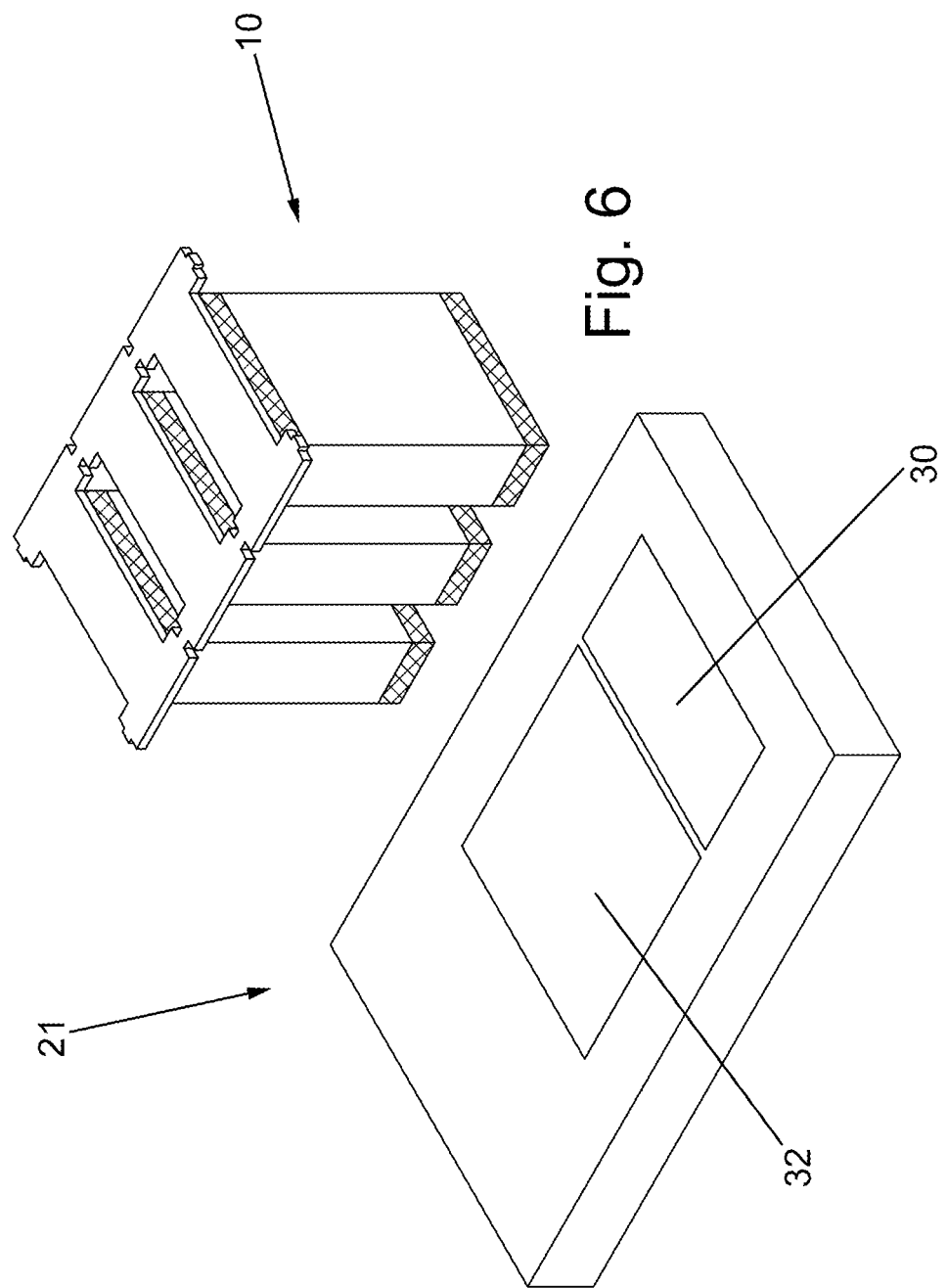
FIG. 6 is a schematic exploded view of an embodiment of the invention.
Figure 7:
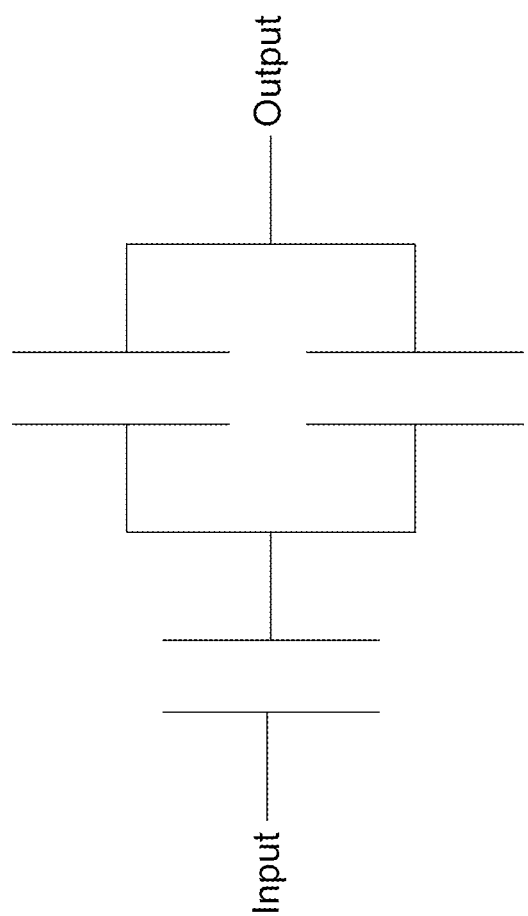
FIG. 7 is a schematic electrical diagram of an embodiment of the invention.

An embodiment of the invention will be described with reference to FIG. 6 wherein an electrical circuit assembly, 21, is illustrated in exploded view comprising an electronic component package, 10, comprising three electronic components for the purposes of illustration. As would be realized an input trace, 30, in electrical contact with an external termination of a first electronic component and an output trace, 32, in electrical contact with a pair external terminations of a pair of electronic components allows for the formation of an electrical circuit diagram as illustrated in FIG. 7 wherein each electronic component is represented as a capacitor for the purposes of illustration without limit thereto.

Figure 8:
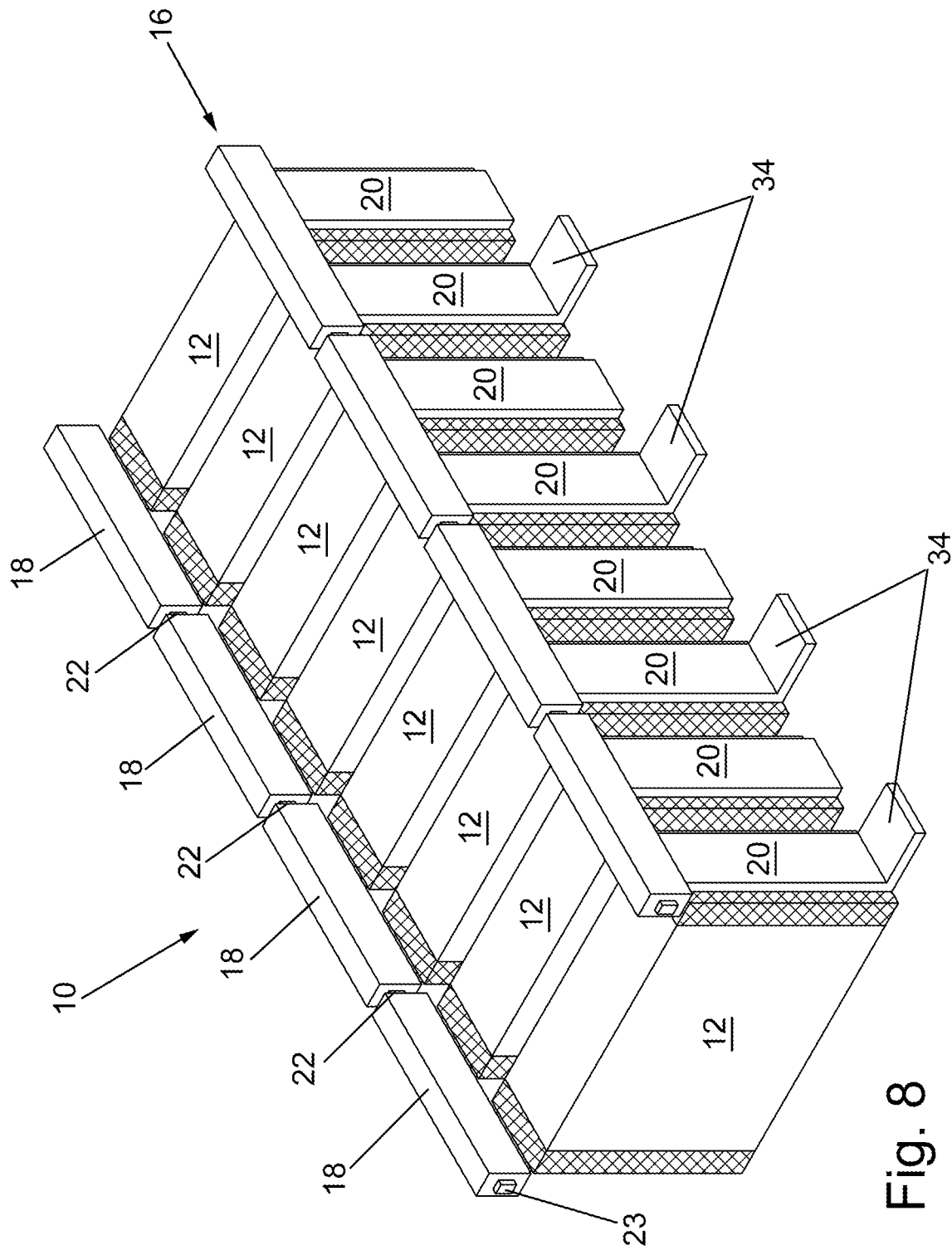
FIG. 8 is a schematic perspective view of an embodiment of the invention.
Figure 9:
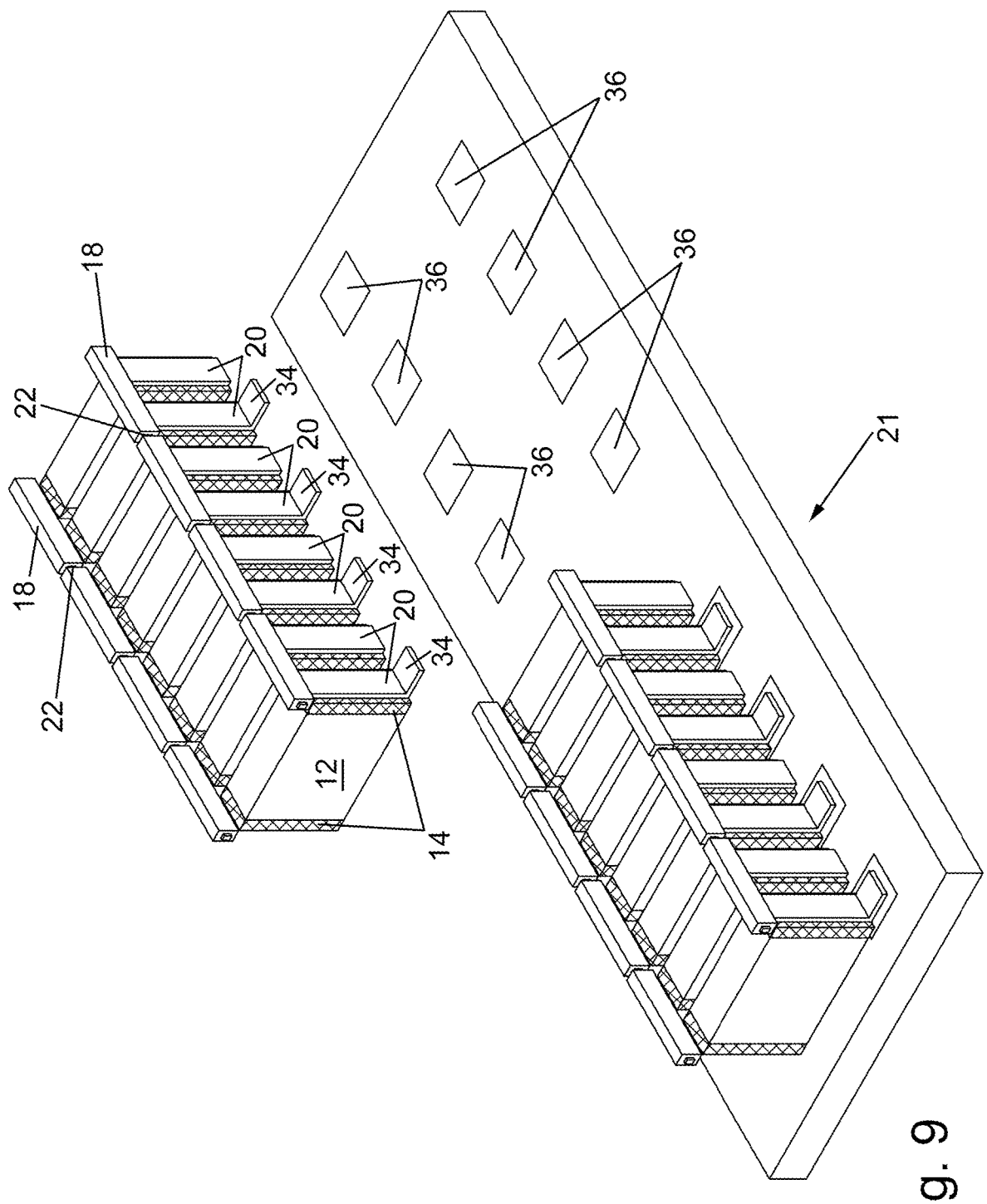
FIG. 9 is a schematic partially exploded view of an embodiment of the invention.

An embodiment of the invention will be described with reference to FIG. 8 wherein an electrical component package, 10, is illustrated schematically in perspective view. In FIG. 8, select leads, 20, of the structural lead frame, 16, comprise stabilizer feet, 34, wherein the stabilizer feet can be mounted to a circuit trace which is either an active trace or a mechanical pad wherein a mechanical pad does not provide electrical conductivity to the circuit. For the purposes of discussion, the component package assembly of FIG. 8 comprises structural lead frames on each side. As would be realized, adjacent capacitors can be electrically serial, electrical parallel or the collection of electronic components may be in combinations of electrically serial and electrically parallel. An advantage of the embodiment of FIG. 8 is illustrated in exploded view in FIG. 9 wherein each stabilizer foot, 34, is in contact with a pad, 36, wherein at least one pad is an input pad, at least one pad is an output pad and the electrical connectivity of the pads and connectivity of adjacent leads can provide for a large number or possibilities in electrical functionality. In one embodiment, adjacent electronic components are in electrical series with a first pad being an input pad, the furthest pad from the input pad being an output pad and the remaining pads being mechanical pads, for structural integrity, or providing electrical connectivity for serial electrical connection. In FIGS. 8 and 9 eight electronic components are illustrated without limit thereto.

Figure 10:
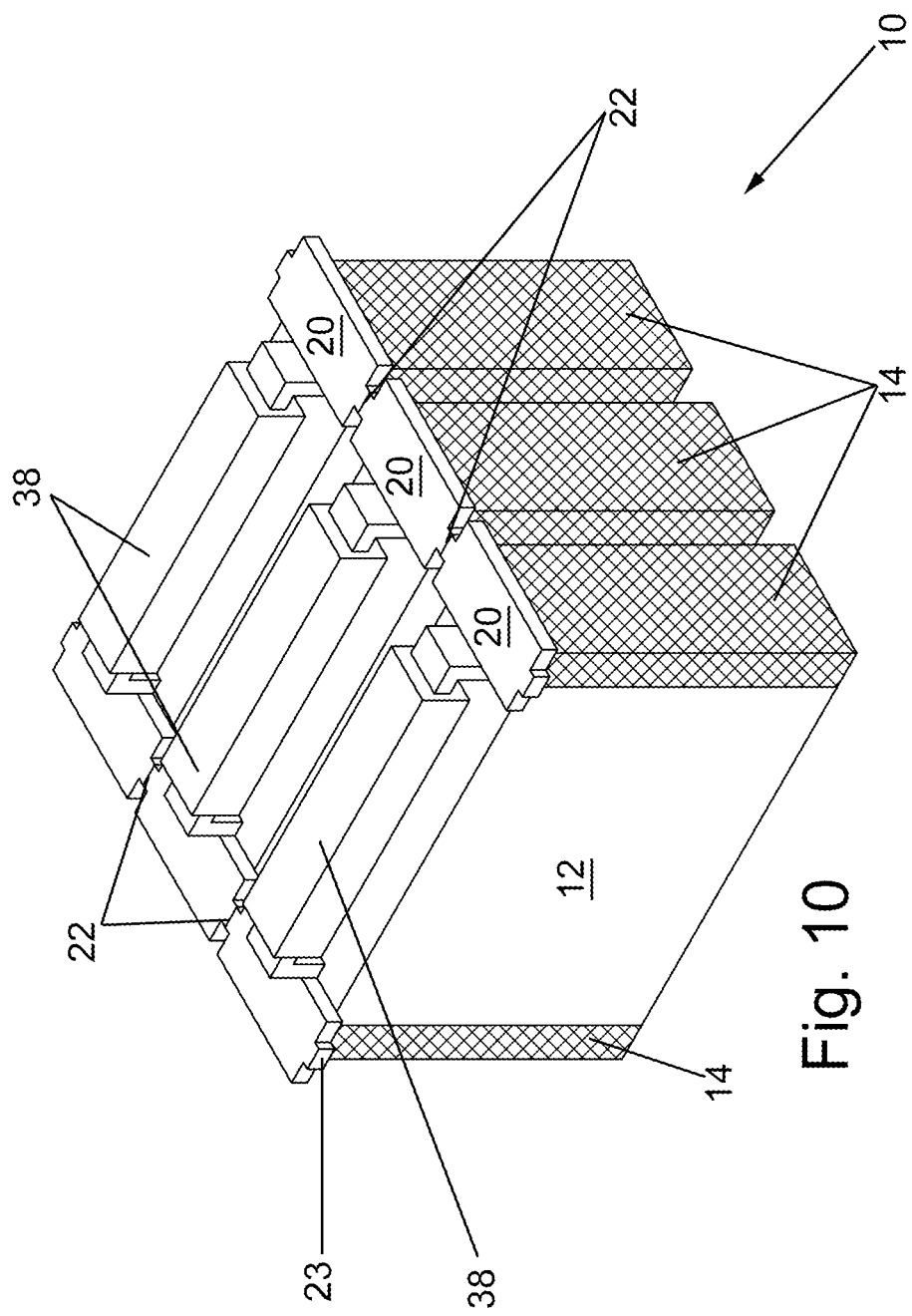
FIG. 10 is a schematic perspective view of an embodiment of the invention.
Figure 11:
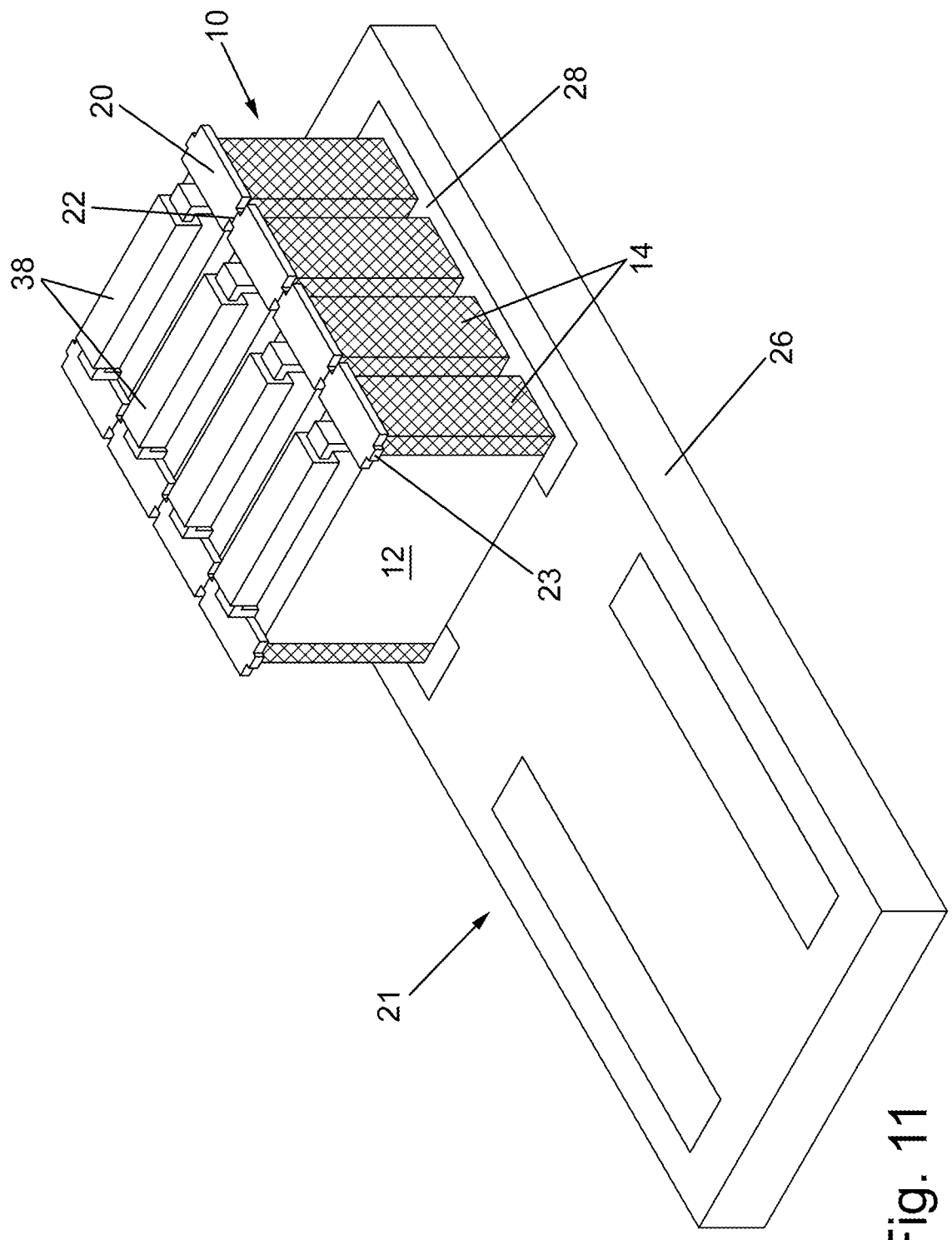
FIG. 11 is a schematic perspective view of an embodiment of the invention.

An embodiment of the invention is illustrated in FIG. 10 wherein an electronic component package, 10, is illustrated schematically. In FIG. 10, the structural lead, 16, comprises leads, 20, which are connected to parallel edges of the external termination of opposite polarity. Leads on a common electronic component, 12, are connected by an insulative connector, 38. Insulative connectors allow an array of electronic components to be assembled, as discussed elsewhere herein, with adjacent electronic components being in electrical parallel. An advantage of the embodiment of FIG. 10 is illustrated in FIG. 11, wherein the electronic component package of FIG. 10 is mounted to a substrate, 26, comprising traces, 28, wherein the electronic components are in electrical parallel. The embodiment of FIG. 10 is illustrated with three electronic components and the embodiment of FIG. 11 is illustrated with four electronic components with the understanding that a large array of electronic components may be formed and a select number of electronic components separated from the large array at break-away features, 22, as discussed elsewhere herein. In the embodiment illustrated in FIGS. 10 and 11 the optional over mold is not illustrated but could be incorporated if desired.

Figure 12:
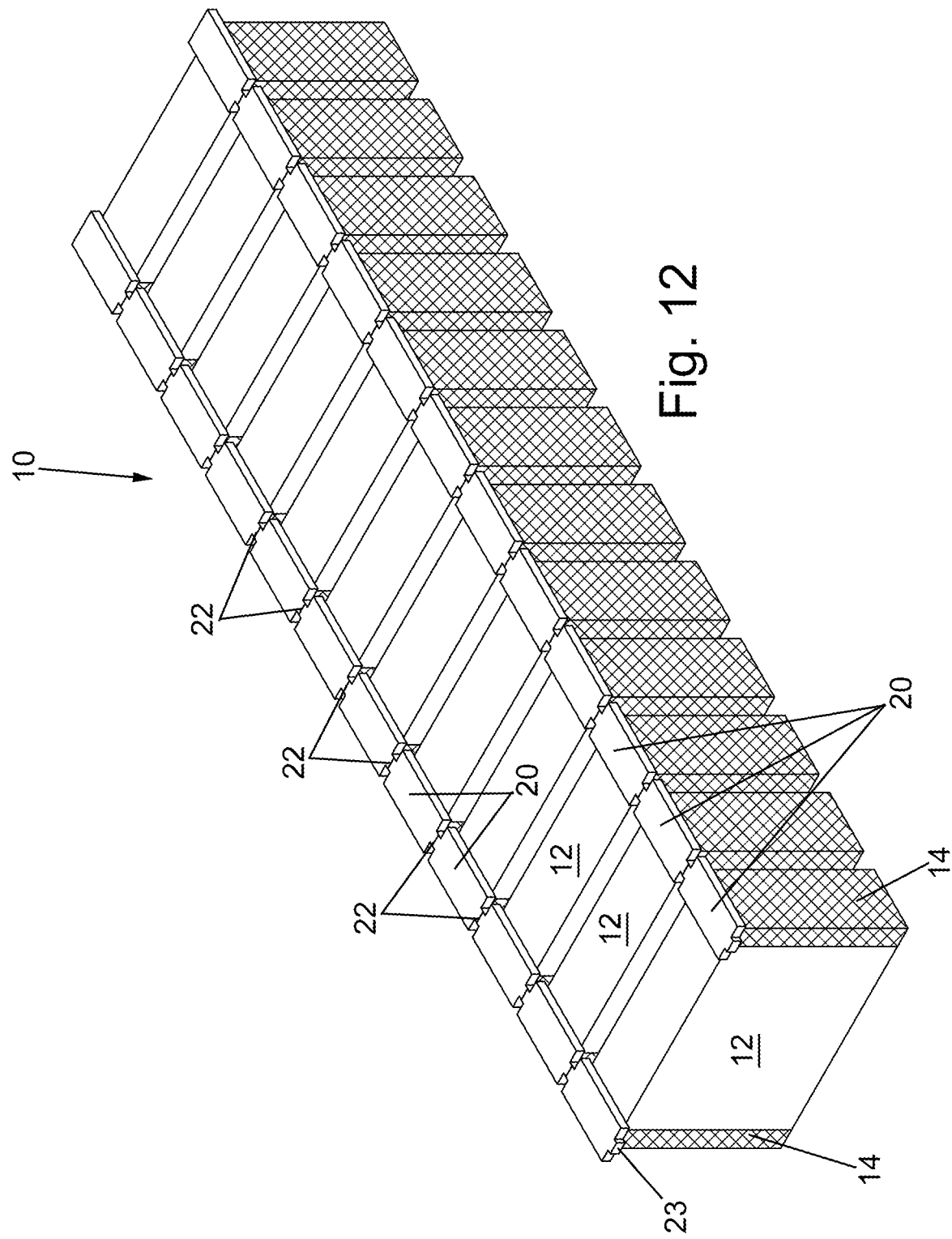
FIG. 12 is a schematic perspective view of an embodiment of the invention.
Figure 13:
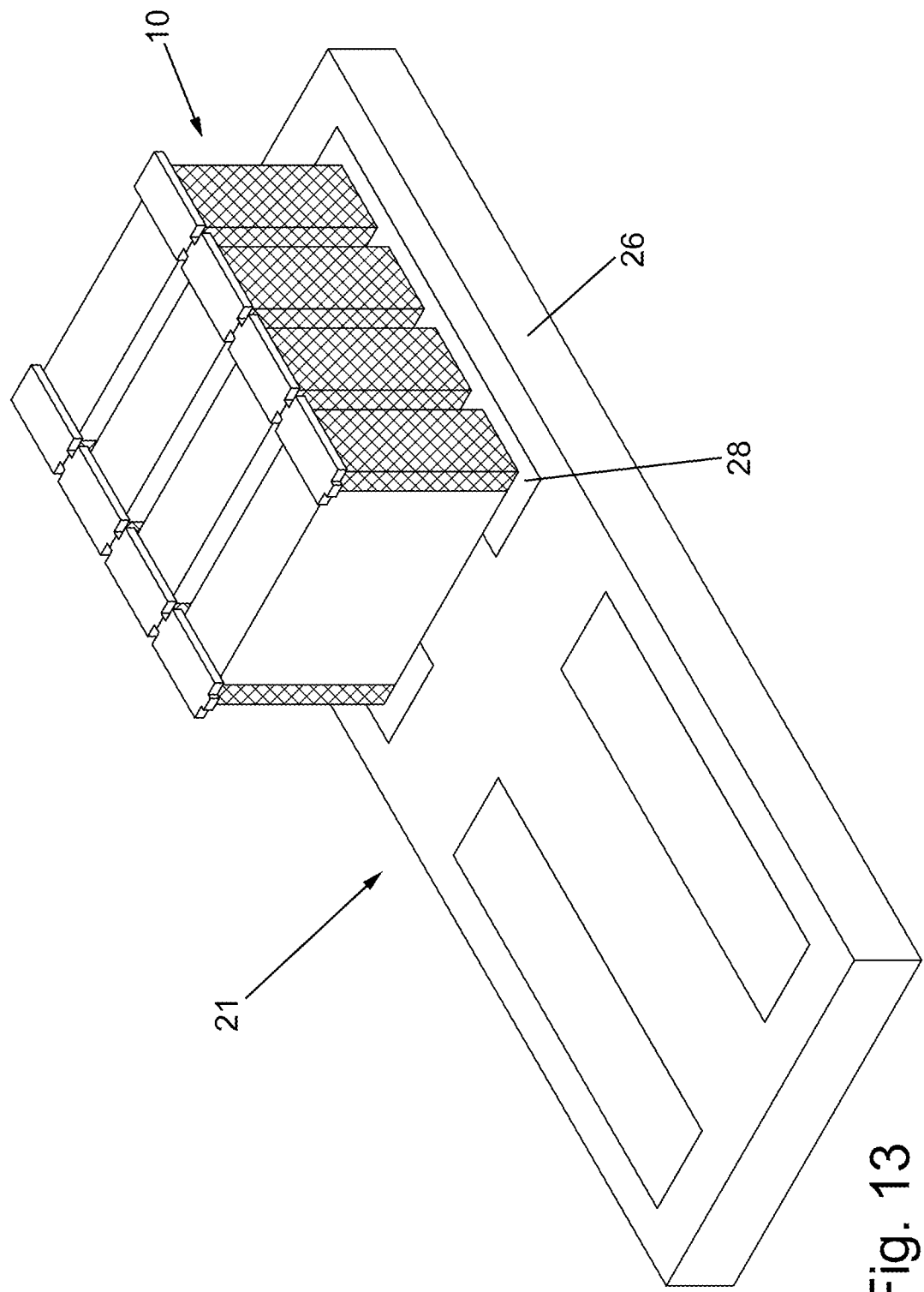
FIG. 13 is a schematic perspective view of an embodiment of the invention.

An embodiment of the invention is illustrated in FIG. 12 wherein illustrated is an electrical component package comprising a multiplicity of vertically oriented electronic components, 12, in a stack. A structural lead frame, 16, is attached to the side faces of the external terminations, 14. In FIG. 12, each adjacent lead, 20, has a break-away feature, 22, there between. As illustrated in FIG. 13, the component assembly package of FIG. 12 is mounted to a circuit board, 26, wherein the side faces opposite the structured lead frame are mounted to a common circuit trace, 28, thereby providing a stack of electronic components in electrical parallel.

Figure 14:
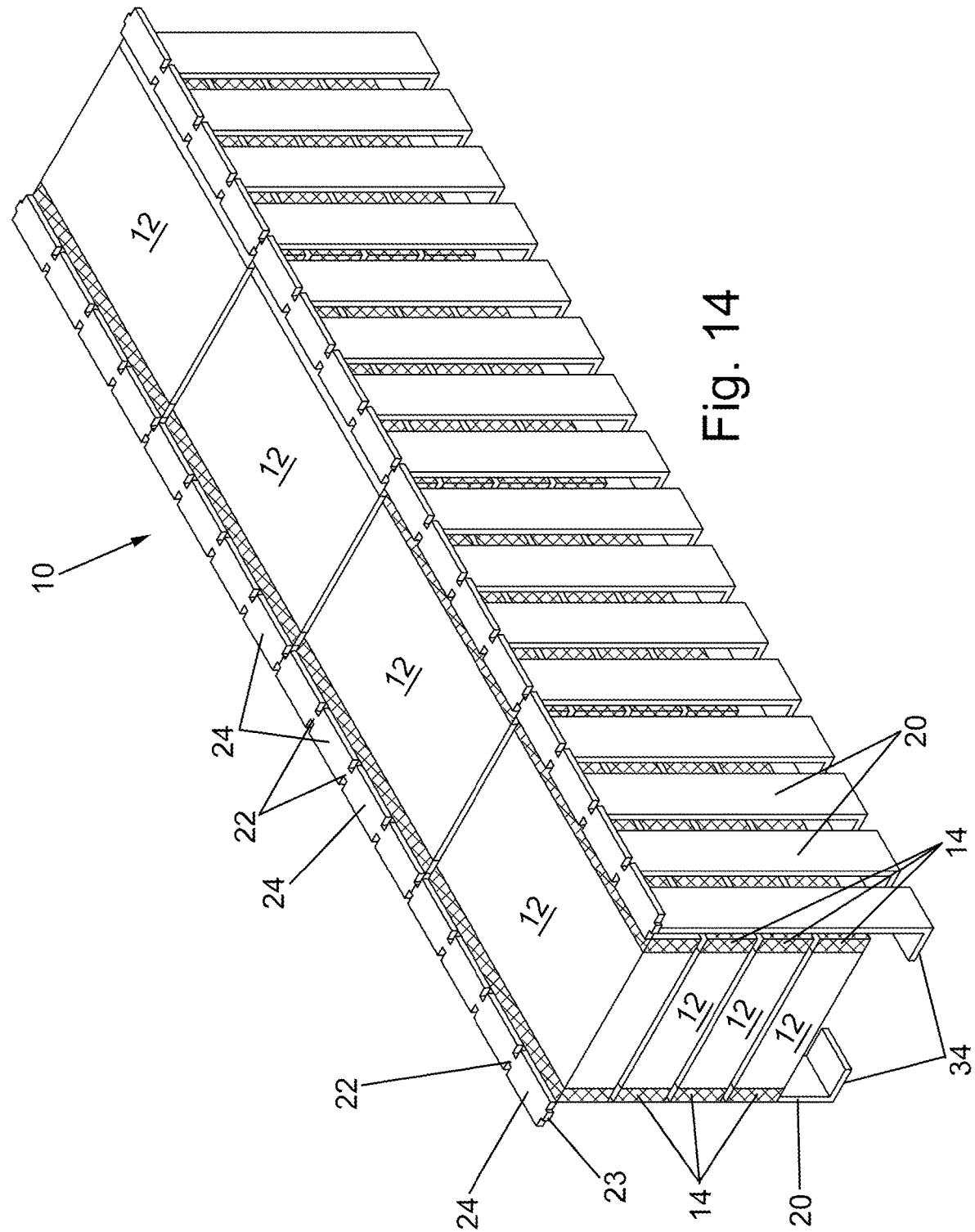
FIG. 14 is a schematic perspective view of an embodiment of the invention.

An embodiment of the invention is illustrated in FIG. 14 wherein illustrated is an electrical component package, 10, comprising a multiplicity of horizontally oriented electronic components, 12. In FIG. 14 each external termination is connected to a plurality of leads, 20, and each lead is mechanically attached to more than one external termination of a plurality of electronic components. Adjacent leads are connected by lead connectors, 24, wherein the lead connectors have break away features, 22, integral thereto. Stabilizer feet, 34, provide a surface for attachment to a circuit trace or a mechanical pad as well as providing additional mechanical stress robustness for the mounted assembly. The orientation of the electronic components in FIG. 14 is defined as a horizontally orientated wherein the largest face of the electronic component is approximately parallel to the printed circuit board.

Figure 15:
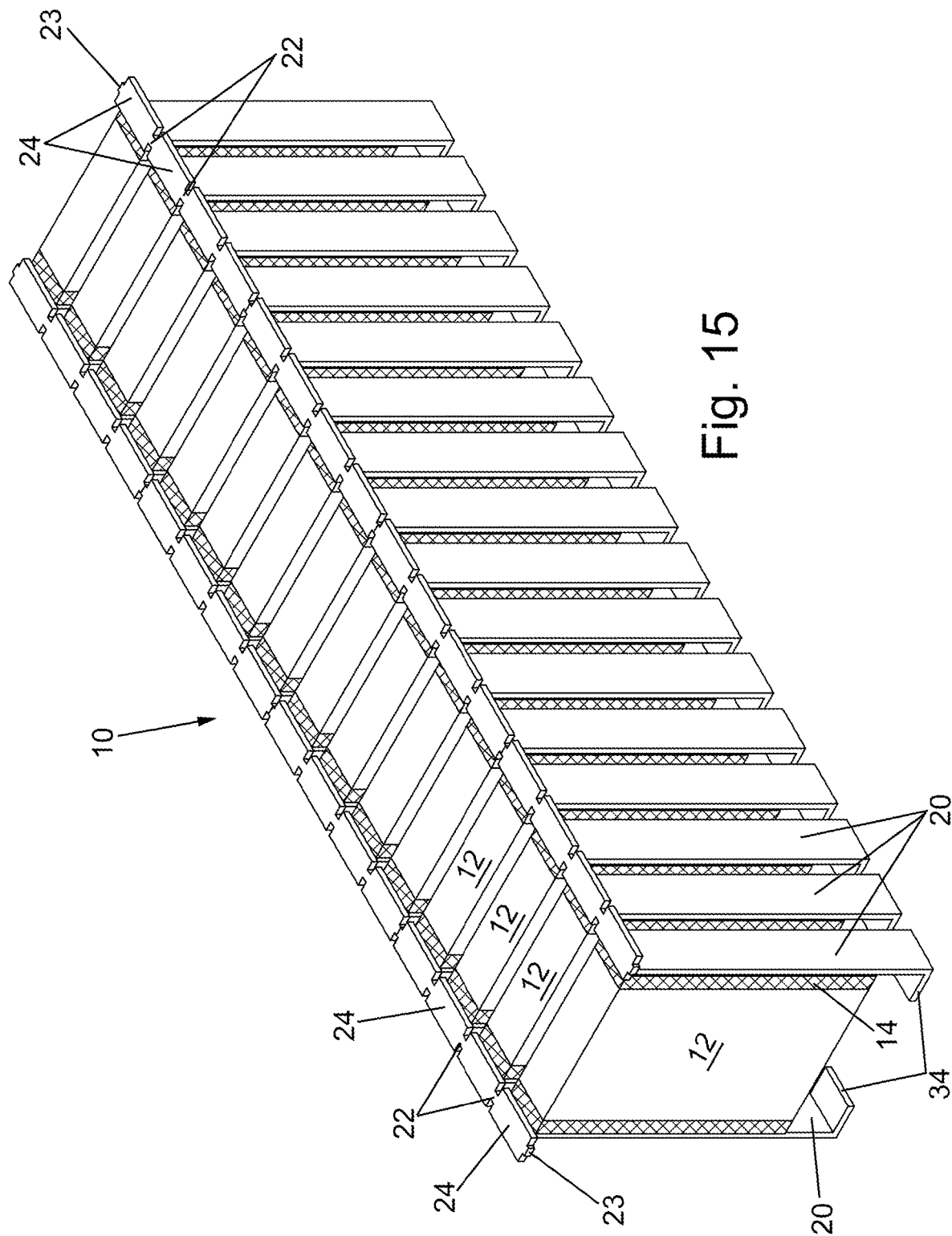
FIG. 15 is a schematic perspective view of an embodiment of the invention.

An embodiment of the invention is illustrated schematically in FIG. 15. In FIG. 15, an electrical component package, 10, is illustrated comprising a plurality of vertically oriented electronic components, 12, wherein each end face of the external termination, 14, is mounted to a dedicated lead, 20. Lead connectors, 24, with break away features, 22, there between, allow for separation of a subset of electronic components into a smaller electrical component package as discussed elsewhere herein. Stability feet, 34, each integral to a lead, allow for mounting to a circuit trace or mechanical pad as well as providing additional mechanical stress robustness for the mounted assembly.

A particular feature is the ability of expanding the electrical capabilities of the electronic component package by the incorporation of auxiliary electronic components which are not in the stack of electronic components but are extraterritorial relative to the space represented by otherwise arrayed electronic components. Auxiliary electronic components are mounted to a surface of the structural lead frame opposite that of the electronic components. The auxiliary electronic component can be the same as, or different from, the electronic components in the array and the auxiliary electronic components are preferably selected from the group consisting of MLCC, a resistor, a varistor, a diode, a fuse, an inductor, an overvoltage discharge device, a sensor, a switch, an electrostatic discharge suppressor and an integrated circuit.

Figure 17:
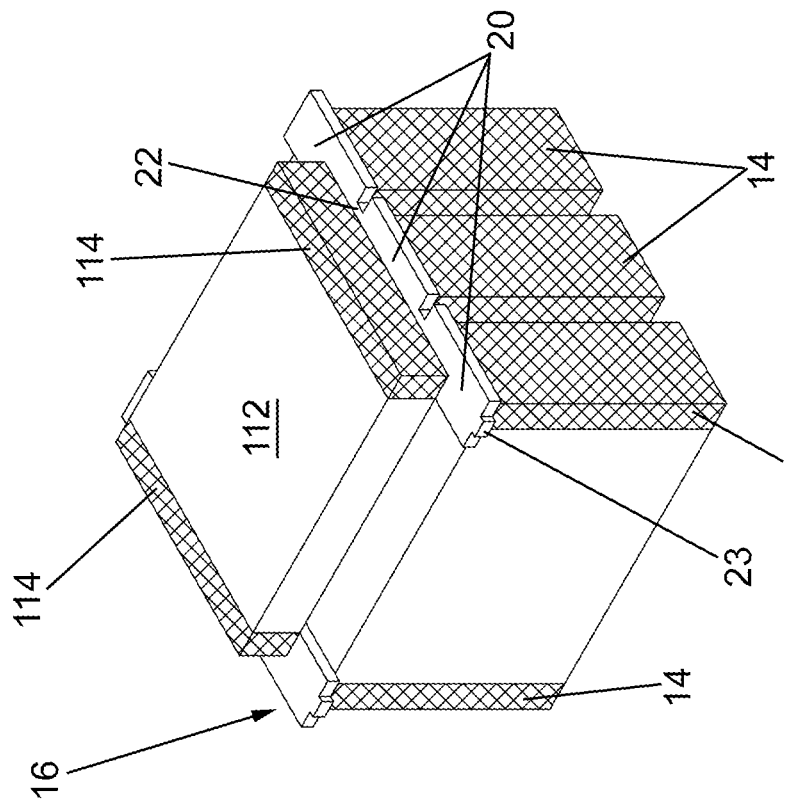
FIG. 17 is a schematic perspective view of an embodiment of the invention.
Figure 16:
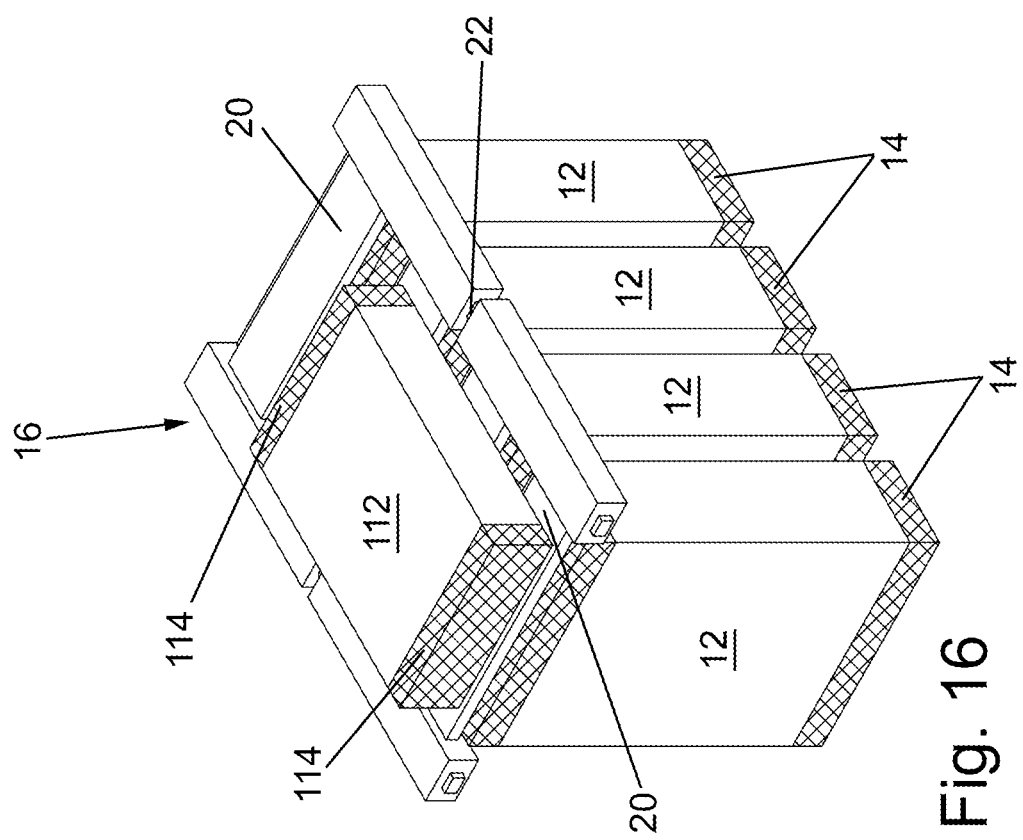
FIG. 16 is a schematic perspective view of an embodiment of the invention.

An embodiment of invention is illustrated schematically in FIGS. 16 and 17 wherein the external terminations, 14, an array of electronic components, 12, are attached to a structural lead frame, 16, as described elsewhere herein. External terminations, 114, of an auxiliary electronic component, 112, are mounted to leads, 20, of the structural lead frame thereby providing electrical functionality in addition to that otherwise provided by the electronic components. By way of non-limiting example, the auxiliary electronic component could be a resistor which allows a resistor to be in electrical parallel with a group of electronic components. A related embodiment is illustrated in FIGS. 18 and 19 wherein the external terminations, 114, of an auxiliary electronic component, 112, are in electrical contact with lead connectors, 24, of the structural lead frame, 16.

A particular advantage of the invention is provided in an electronic component package comprising cooling components, particularly static cooling components, to mitigate increases in temperature. The cooling component is preferably attached the structural lead frame of the module with an electrically insulative, thermally conducting, interface that can be in the form of either a pad or a dispensed material.

An embodiment of the invention is illustrated schematically in exploded view in FIG. 20 and assembled view in FIG. 21. In FIGS. 20 and 21 an electrical component package, 10, is illustrated as described elsewhere herein. An electrically insulating, preferably thermally conductive, pad, 40, is attached to a thermally conductive component of the structural lead frame, 16, such as a lead or a lead connector. A thermal dissipation element, 42, is attached to the pad. The thermal dissipation element is preferably a high surface area element, such as a heat sink, which allows heat to be dissipated to a medium such as flowing air.

The structural lead frame is preferably bonded to the external termination by a conductive adhesive. Conductive adhesives are not particularly limited herein with solders; polymers comprising metals or alloys particularly polymers that cure or cross link within a specified temperature range and TLPS represent exemplary conductive adhesives suitable for demonstration of the invention. It is preferable that the melting point of the conductive adhesive in the assembled electrical component package be higher than the melting point of the conductive adhesive used to attach the assembled electrical component package to the circuit board. Therefore, TLPS adhesives are particularly suitable for demonstration of the invention.

Transient liquid phase sintering bonds are distinguishable from solders. TLPS materials are mixtures of two or more metals or metal alloys prior to exposure to elevated temperatures thereby distinguishing the thermal history of the material. TLPS materials exhibit a low melting point prior to exposure to elevated temperatures, and a higher melting point following exposure to these temperatures. The initial melting point is the result of the low temperature metal or an alloy of two low temperature metals. The second melting temperature is that of the intermetallic formed when the low temperature metal or alloy forms a new alloy with a high temperature melting point metal thereby creating an intermetallic having a higher melting point. TLPS materials form a metallurgical bond between the metal surfaces to be joined. Unlike tin/lead or lead (Pb) free solders, the TLPS does not spread as they form the intermetallic joint. Rework of the TLPS system is very difficult due to the high secondary reflow temperatures. Transient Liquid Phase Sintering is the terminology given to a process to describe the resulting metallurgical condition when two or more TLPS compatible materials are brought in contact with one another and raised to a temperature sufficient to melt the low temperature metal. To create a TLPS process or interconnect at least one of those metals is from a family of metals having a low melting point, such as tin (Sn) or indium (In), and the second metal is from a family having high melting points, such as copper (Cu) or silver (Ag). When Sn and Cu are brought together, and the temperature elevated, the Sn and Cu form CuSn intermetallics and the resulting melting point is higher than the melting point of the metal having a low melting point. In the case of In and Ag, when sufficient heat is applied to the In to cause it to melt it actually diffuses into the Ag creating a solid solution which in turn has a higher melting point than the In itself. TLPS will be used to generically reference the process and the TLPS compatible materials used to create a metallurgical bond between two or more TLPS compatible metals. TLPS provides an electrical and mechanical interconnect that can be formed at a relatively low temperature (<300° C.) and having a higher secondary re-melt temperature. These temperatures are determined by the different combination of TLPS compatible metals. TLPS will be used to generically pertain to the process and materials used to create a TLPS metallurgical bond or interconnect.

TLPS bonds can be formed at relatively low initial process temperatures, as low as 157° C. Once the TLPS bond process is complete, the resulting joint has a much higher melting temperature than its initial process temperature, typically greater than 300° C., with a higher secondary melting, such as above 450° C., being common for many material sets. TLPS differs from traditional solders in that solders are formed by melting two or more metals together to create an alloy having specific properties. These properties can be altered simply by adding additional metals to the alloy or by changing the % composition of the metals in the alloy. The solder alloy can then be remelted and solidified to join two or more surfaces. TLPS initially is not an alloyed material like that of solder alloys. TLPS is a metallurgical process based on the diffusion or sintering of two or more metals into one another and occurs specifically at the interface between two surfaces. Once a TLPS interface is created it cannot be re-melted at a low temperature. The higher re-melt temperature of TLPS, once the sintering or diffusion process has been completed, prohibits re-work of the assembly in many cases since these will sustain irreparable damage at these high temperatures. The TLPS process is achieved by bringing a low temperature melting metal, such as indium or tin, in contact with a high temperature melting metal, such as silver or copper, and elevating the temperature to a point where the low temperature metal melts and diffuses or sinters with the high melting temperature material. The rate of diffusion or sintering is a time temperature function and is different for the different combinations of metals. The result is a solid solution having a new melt temperature approaching that of the high temperature melting metal.

The TLPS technology is particularly suited to providing both a mechanical and electrically conductive metallurgical bond between two mating surfaces that are relatively flat. The metals typically used for the TLPS process are selected from two metal families. One consists of low melting temperature metals such as indium, tin, lead, antimony, bismuth, cadmium, zinc, gallium, tellurium, mercury, thallium, selenium, or polonium and a second family consist of high temperature melting metals such as silver, copper, aluminum, gold, platinum, palladium, beryllium, rhodium, nickel, cobalt, iron and molybdenum to create a diffused solid solution.

It is highly desirable to use a flux free process to eliminate any potential voids within the joint. Since TLPS is a sintering based process, the bond line is uniform and void free. Fluxes, which are necessary with solders, get entrapped in the joint and are subsequently burned out thus leaving a void. In the case with the semi-conductor industry, and specifically with die attach processes, these voids can create hot spots within the integrated circuit (I/C) which can lead to premature failure and reliability issues. TLPS addresses this issue since TLPS is a sintering process and free of fluxes. When the two metals are mated together and heat is applied, the lower melting metal diffuses into the higher melting metal to create a solid solution across the mating surface area. To create a solid uniform bond line it is mandatory that the mating surfaces be flat and coplanar to insure intimate contact across the entire mating surface. The required flatness of the mating surfaces also limits the application of this technology because there are many surfaces that are not sufficiently planar to yield a good joint.

A TLPS compatible metal particle core combined with a liquid carrier material to form a paste can be applied between two non-planar non-uniform surfaces having mixed surface preparation technologies such as plating, sintered thick film, and or plated sintered thick film and then heating to the melting temperature of the metal having the lowest melting point and holding that temperature for a sufficient amount of time to form a joint. A single metal particle core eliminates the need for multiple metals in a paste thus making the ratios of metals a non-issue. It is also possible to create a single particle by using silver, a metal having a high melting point of approximately 960° C. as a core particle, and then coating that particle with a metal shell having a low temperature metal such as indium having a melting point of 157° C. The advantage of using indium is that as it melts it diffuses into silver. If this bi-metal particle of silver and indium is placed between two surfaces each coated with silver, the indium will then diffuse into the silver surfaces as well as the silver core creating a solid solution joint. Other metals having a low melting point such as indium that could be considered for this bi-metal single particle include tin, antimony, bismuth, cadmium, zinc, gallium, tellurium, mercury, thallium, selenium, polonium or lead and metals having high melting points such as silver are, copper, aluminum, gold, platinum, palladium, beryllium, rhodium, nickel, cobalt, iron and molybdenum may also be considered as possible combinations.

Indium powder mixed with a flux and solvent to form a paste can be applied to produce a TLPS metallurgical bond between two coupons having a base metal of copper overplated with Ni and then overplated with about 5 microns of silver. The samples can be prepared by dispensing the indium paste onto a coupon having the plated surfaces as mentioned and then placing two coupons in contact with one another and heated to 150° C. for 5 seconds, followed by increasing the temperature to about 320° C. for about 60 seconds. The joint strength of the sample thus prepared can exhibit a pull weight in the range of 85-94 pounds equating to shear stress of 4,177 psi and a pull peel weight in the range of 5-9 pounds with an average of 7 pounds can be achieved. These results are comparable to results for SnPb solders having shear strengths of approximately 3000 psi and pull peel strengths in the 7-10 pounds range. One major difference is that the AgIn joint can withstand secondary melt temperatures exceeding 600° C. These results indicate that the In paste used to bond two silver plated coupons is at least equivalent if not stronger than current solder SnPb solders but also has a much higher secondary melt temperature thus yielding a material suitable for high temperature interconnect applications and also being lead free.

EXAMPLE

An electronic component package was assembled and mounted to a substrate as illustrated in FIG. 4. The electronic components were fourteen matching MLCCs with a structural lead frame attached to one end face of the MLCC to form a module of MLCC's connected in electrical series. The rated capacitance value (CV) of each MLCC in the module was 12,000 pF and the serial circuit of fourteen MLCCs in the module had a CV of 882 pF measured at @ 1 kHz. The measured value was within the tolerance of the rated value of the MLCC module. The rated voltage of each discrete MLCC was 250 VDC and the rated voltage of the serial circuit of fourteen MLCCs in the module was 3,500 VDC.

The invention has been described with reference to preferred embodiments without limit thereto. One of skill in the art would realize additional embodiments which are described and set forth in the claims appended hereto.

The invention claimed is:

1. An electronic component package comprising:
   a multiplicity of electronic components wherein each electronic component of said electronic components comprises a first external termination and a second external termination;
   a structural lead frame comprising multiple leads wherein each lead of said multiple leads is mounted to at least one said first external termination;
   wherein said structural lead frame comprises a break away artifact and at least one break away feature between adjacent said leads for separating adjacent said electronic components into a first electrical component package and a second electrical component package; and
   wherein at least two said electronic components are electrically connected in parallel.

2. The electronic component package of claim 1 comprising at least three said electronic components wherein at least two said electronic components are electrically connected serially.

3. The electronic component package of claim 1 wherein each said first external termination comprises an end face and side faces.

4. The electronic component package of claim 3 wherein at least one lead of said multiple leads is connected to said first external termination at said end face or at a side face of said side faces.

5. The electronic component package of claim 1 wherein said structural lead frame comprises at least one lead connector between adjacent said leads.

6. The electronic component package of claim 5 wherein said break away feature is integral to at least one said lead connector.

7. The electronic component package of claim 1 wherein said lead comprises ferrous or non-ferrous material.

8. The electronic component package of claim 1 wherein each said electronic component is independently selected from the group consisting of an MLCC, a resistor, a varistor, a diode, a fuse, an inductor, an overvoltage discharge device, a sensor, a switch, an electrostatic discharge suppressor and an integrated circuit.

9. The electronic component package of claim 1 wherein each said electronic component is an MLCC.

10. The electronic component package of claim 1 wherein at least one said lead of said multiple leads is mounted to said at least one first external termination by a conductive adhesive selected from solders; polymers comprising metals or alloys; and transient liquid phase sintered material.

11. The electronic component package of claim 10 wherein at least one said lead of said multiple leads is mounted to said at least one first external termination by a transient liquid phase sintered material.

12. The electronic component package of claim 1 further comprising an over mold on at least a portion of said structural lead frame.

13. The electronic component package of claim 1 wherein said multiplicity of electronic components are mounted in an orientation selected from vertically oriented and horizontally oriented.

14. The electronic component package of claim 1 further comprising a second structural lead frame comprising multiple second leads wherein each second lead of said second leads is mounted to at least one second external termination.

15. The electronic component package of claim 1 further comprising at least one auxiliary electronic component mounted to said structural lead frame.

16. The electronic component package of claim 15 wherein each said auxiliary electronic component is independently selected from the group consisting of an MLCC, a resistor, a varistor, a diode, a fuse, an inductor, an overvoltage discharge device, a sensor, a switch, an electrostatic discharge suppressor and an integrated circuit.

17. The electronic component package of claim 1 further comprising at least one thermal dissipation element mounted to said structural lead frame.

18. The electronic component package of claim 17 further comprising an electrical insulator between said thermal dissipation element and said structural lead frame.

19. The electronic component package of claim 1 further comprising at least one stabilizer foot attached to said structural lead frame.

20. The electronic component package of claim 1 wherein said structural lead frame comprises an insulative connector between adjacent leads.

21. The electronic component package of claim 1 wherein at least one said lead of said leads is mounted to multiple first external terminations.

22. An electrical circuit assembly comprising:
   an electronic component package comprising:
   a multiplicity of electronic components wherein each electronic component of said electronic components comprises a first external termination and a second external termination wherein at least two said electronic components are electrically connected in parallel;
a structural lead frame comprising multiple leads wherein each lead of said multiple leads is mounted to at least one said first external termination; and
wherein said structural lead frame comprises at least one break away feature between adjacent said leads for separating adjacent said electronic components into a first electrical component and a second electrical component and a break away artifact; and
a circuit board wherein said circuit board comprises a first trace and a second trace and at least one said lead is in electrical contact with said first trace.

23. The electrical circuit assembly of claim 22 wherein at least two said electronic components are electrically connected serially.

24. The electrical circuit assembly of claim 23 wherein a direction of current flow in said at least two said electronic components is opposite.

25. The electrical circuit assembly of claim 22 wherein at least two said electronic components are electrically connected in parallel.

26. The electrical circuit assembly of claim 22 wherein each said first external termination comprises an end face and side faces.

27. The electrical circuit assembly of claim 26 wherein at least one lead of said multiple leads is connected to said first external termination at said end face or at a side face of said side faces.

28. The electrical circuit assembly of claim 22 wherein said structural lead frame comprises at least one lead connector between adjacent said leads.

29. The electrical circuit assembly of claim 28 wherein said break away feature is integral to at least one said lead connector.

30. The electrical circuit assembly of claim 22 wherein said lead comprises ferrous or non-ferrous material.

31. The electrical circuit assembly of claim 22 wherein each said electronic component is independently selected from the group consisting of an MLCC, a resistor, a varistor, a diode, a fuse, an inductor, an overvoltage discharge device, a sensor, a switch, an electrostatic discharge suppressor and an integrated circuit.

32. The electrical circuit assembly of claim 22 wherein each said electronic component is an MLCC.

33. The electrical circuit assembly of claim 22 wherein at least one said lead of said multiple leads is mounted to said at least one first external termination by a conductive adhesive selected from solders; polymers comprising metals or alloys; and transient liquid phase sintered material.

34. The electrical circuit assembly of claim 33 wherein at least one said lead of said multiple leads is mounted to said at least one first external termination by a transient liquid phase sintered material.

35. The electrical circuit assembly of claim 22 further comprising an over mold on at least a portion of said structural lead frame.

36. The electrical circuit assembly of claim 22 wherein said multiplicity of electronic components are mounted in an orientation selected from vertically oriented and horizontally oriented.

37. The electrical circuit assembly of claim 22 further comprising a second structural lead frame comprising multiple second leads wherein each second lead of said second leads is mounted to at least one second external termination.

38. The electrical circuit assembly of claim 22 further comprising at least one auxiliary electronic component mounted to said structural lead frame.

39. The electrical circuit assembly of claim 38 wherein each said auxiliary electronic component is independently selected from the group consisting of an MLCC, a resistor, a varistor, a diode, a fuse, an inductor, an overvoltage discharge device, a sensor, a switch, an electrostatic discharge suppressor and an integrated circuit.

40. The electrical circuit assembly of claim 22 further comprising at least one thermal dissipation element mounted to said structural lead frame.

41. The electrical circuit assembly of claim 40 further comprising an electrical insulator between said thermal dissipation element and said structural lead frame.

42. The electrical circuit assembly of claim 22 further comprising at least one stabilizer foot attached to said structural lead frame.

43. The electrical circuit assembly of claim 42 wherein said circuit board comprises a mechanical pad and at least one said stabilizer foot is mounted to said mechanical pad.

44. The electrical circuit assembly of claim 22 wherein said structural lead frame comprises an insulative connector between adjacent leads.

45. The electrical circuit assembly of claim 22 wherein at least one said lead of said leads is mounted to multiple first external terminations.

* * * * *